United States Patent [19]

Olson

[11] Patent Number: 5,209,047

[45] Date of Patent: May 11, 1993

[54] TUBE LOADER FOR INTEGRATED CIRCUIT PARTS

[75] Inventor: David Olson, Tempe, Ariz.

[73] Assignee: VLSI Technology, Inc., San Jose, Calif.

[21] Appl. No.: 939,221

[22] Filed: Sep. 2, 1992

[51] Int. Cl.$^5$ .......................... B65B 5/10; B65B 35/10
[52] U.S. Cl. ........................................ 53/506; 53/255
[58] Field of Search .................... 53/506, 505, 52, 255, 53/244, 236, 235, 473; 221/151, 154

[56] References Cited

U.S. PATENT DOCUMENTS

| | | | |
|---|---|---|---|
| 2,765,101 | 10/1956 | Shanhouse et al. | 221/154 X |
| 2,948,094 | 8/1960 | Wells | 53/506 X |
| 3,574,986 | 4/1971 | Dieter | 53/506 X |
| 4,030,268 | 6/1977 | Payne | 53/506 X |
| 4,146,122 | 3/1979 | Harris | 221/154 X |

*Primary Examiner*—James F. Coan
*Attorney, Agent, or Firm*—LaValle D. Ptak

[57] ABSTRACT

Integrated circuit parts to be loaded are guided down an inclined ramp in a guideway for gravity feeding into a storage and transport tube. A tube holder member is attached to the bottom of the ramp; and it has an aperture through it for receiving a tube to be loaded. A blocking device, in the form of a lever arm, is attached to the tube holder member, and extends into the guideway through which the integrated circuit devices travel. When a tube is inserted into the tube holder member, a projection on the lever arm is engaged by the end of the tube to move the lever arm out of engagement with the guideway or any integrated circuit parts in it. When the tube is full of parts, it is removed from the tube holder member and the lever arm drops into place to either rest on the top of the next integrated circuit part in line or to fall into the guideway to prevent further movement of parts into the tube holder member.

19 Claims, 1 Drawing Sheet

TUBE LOADER FOR INTEGRATED CIRCUIT PARTS

RELATED APPLICATION

This application is related to co-pending application (VLSI Disclosure #1509) Ser. No. 07/939,215, filed on Sep. 2, 1992.

BACKGROUND

In the manufacture of large scale integrated circuit devices it is necessary to package the devices in a way which minimizes handling, and which minimizes potential damage to the devices particularly to the leads. In addition, since most large scale integrated circuit devices are fabricated from CMOS circuitry, the packaging is made of materials which substantially minimize or eliminate static electricity.

A common form of package is an elongated plastic tube, which is cut into various lengths depending upon the number of integrated circuit devices which are to be stored in it. The internal crosssectional configuration of the tube is made to conform with the cross section of integrated circuit devices which are to be stored in it. Typically, the tubes are cut from long lengths of tubular material. One of the ends then is closed or plugged, and the parts to be stored in and carried by the tube are placed into it from the other end. After the desired number of parts have been placed in the tube, the other open end is plugged or sealed. The parts then may be shipped to the end consumer in such a tube.

If large scale integrated circuit parts with a large number of leads on them are manually loaded into the storage and transport tubes, the leads on the integrated circuit parts fairly easily may be damaged. Consequently, handling of the integrated circuit parts should be reduced as much as possible.

It is desirable to provide a loading mechanism for facilitating the loading of integrated circuit devices into storage and transport tubes in a device which is simple to operate and which reduces to as great an extent as possible, the manual handling of the integrated circuit devices.

SUMMARY OF THE INVENTION

It is an object of this invention to provide an improved tube loading machine for loading integrated circuit devices into a storage tube.

It is another object of this invention to provide an improved manual tube loading mechanism.

It is another object of this invention to provide an improved tube loading mechanism for loading or reloading integrated circuit devices into tubes without requiring manually handling of the integrated circuit devices.

It is a further object of this invention to provide an improved tube loading mechanism for loading integrated circuit devices into tubes, and for facilitating the removal of full tubes and the placement of empty tubes from the loading mechanism by automatically interrupting the supply of integrated circuit devices whenever no tube is in place for receiving such devices.

In accordance with a preferred embodiment of the invention, a tube loader is placed at the end of an inclined ramp, which has a guideway in it for gravity feeding of integrated circuit device from the upper end of the ramp to the lower end of the ramp. The devices then are loaded into storage and transport tubes at the lower end of the ramp. A tube holding member at the lower end of the ramp has an aperture through it for receiving the open end of a tube to be filled with integrated circuit devices. When the tube is inserted into the tube loading member, a mechanical stop is moved out of engagement with a guideway to permit integrated circuit devices to slide into the tube. After the tube is full, or when it is removed from the tube holder member, the mechanical blocking device engages either the guideway or the next integrated circuit device in the line of devices to be loaded to prevent further movement of devices down the inclined ramp. When an empty tube is inserted into the tube holder, the blocking device is moved out of the way to permit devices to continue sliding down the ramp into the tube to be loaded.

DETAILED DESCRIPTION

Figure 1:
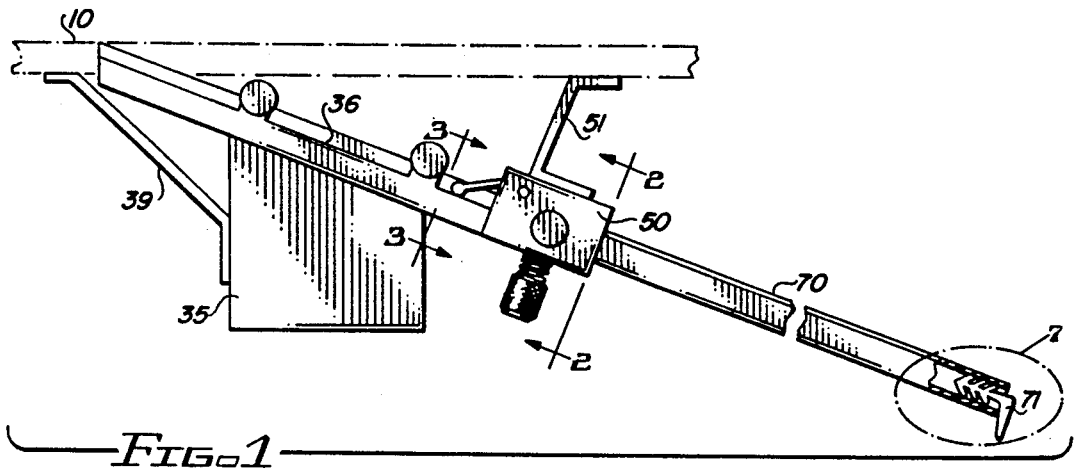
FIG. 1 is a side elevation of a preferred embodiment of the invention.

Reference now should be made to the drawing, in which the same reference numbers are used in the different figures to designate the same components. As illustrated in FIG. 1, the tube loading mechanism receives integrated circuit devices or integrated circuit packages from a source of such packages. A typical source may be the detaping machine of the above-identified co-pending application. The mechanism is set on a base 35, which has a brace member 39 coupling it to a horizontal platform 10, from which the integrated circuit packages or devices are supplied. These portions of the mechanism are the same as those described in the above identified co-pending application. Devices to be packaged into storage and transport tubes then slide down a ramp 36, which has a guideway (not shown) on it for guiding the integrated circuit devices sequentially, one after another, by gravity, down the ramp 36. The details of the ramp 36 are not illustrated; but any suitable ramp with an associated guideway on it may be employed. A ramp which specifically has been found to serve the purpose is the ramp 36, which is described in greater detail in the above identified co-pending application.

In order to facilitate the automatic gravity loading of integrated circuit packages or integrated circuit devices into storage and transport tube, such as the tube 70 shown in FIG. 1, a tube holder block or member 50 is attached by means of a bracket 51 to the underside of the platform 10 illustrated in FIG. 1. The tube holder block 50 also is connected to the bottom end of the ramp 36, and may form an integral part of the ramp 36 at the lower end, as shown most clearly in the partially cut-away views of FIGS. 4 and 5.

The tube holder block 50 has a rectangular aperture 60 formed through it in alignment with the discharge end of the guideway through which the integrated circuit packages move down the ramp 36. As shown most clearly in FIGS. 2 and 3, the aperture 60 is of uniform cross section throughout its length, and passes entirely through the block 50.

At the upper end (or left-hand end of the block 50 as shown in FIGS. 1, 4, 5 and 6), a slot 53 extends upwardly through the center of the block 50 in communication with the aperture 60. One end of a lever 54 is pivotally located in the slot 53 by attaching it to a pivot 55 extending through the block 50. The other end of the lever 54 has an enlarged ball-like projection 58 on it, which extends into the guideway on the ramp 36, or onto the top of an integrated circuit device 17 (which may be located in the guideway) whenever no tube 70 is located in the aperture 60. This is shown most clearly in the cross-sectional view of FIG. 4.

Figure 4:
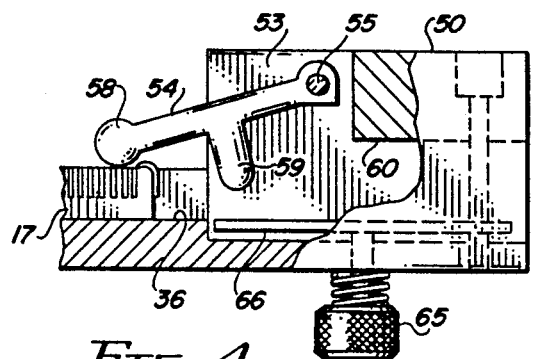
FIG. 4 is a partially cut away side detail of a portion of the embodiment shown in FIG. 1 in one state of operation.

In FIG. 4, the enlarged end 58 of the lever arm 54 is shown engaging the top surface of an integrated circuit device 17 located on the ramp 36. The weight of the lever arm 54 and the material out of which the end 58 is made or with which it is covered, is selected to frictionally engage the top of an integrated circuit device 17 to hold it in place to prevent that device, and any others which may be located above it on the ramp 36, from moving under the force of gravity into the aperture 60 of the tube holding member 50. As is readily apparent from an examination of FIG. 4 if no device 17 is present at the position shown, the end 58 of the lever arm 54 comes to rest on the surface of the ramp 36, also blocking any integrated circuit devices 17 from sliding down the ramp and entering into the aperture 60.

Figure 5:
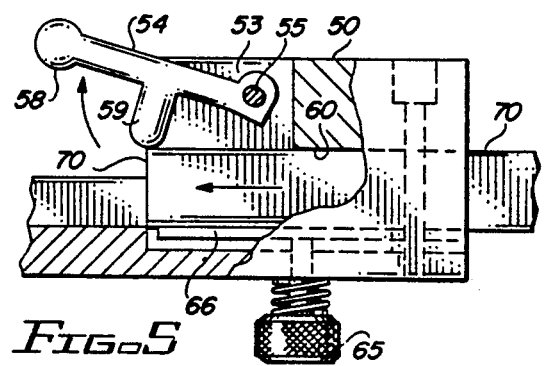
FIG. 5 is a partially cut away side detail of the same portion shown in FIG. 4, but in a different state of operation.

The lever arm 54 is provided with downwardly extending projection 59 intermediate the pivot 55 and the end 58. As shown most clearly in FIGS. 2, 3, 4 and 5, the projection 59 extends into the end of the aperture 60 when the lever arm 54 is in its gravity-biased downward position. When a tube 70, which is to be filled, is inserted into the aperture 60, the open end of the tube 70 is inserted fully into the aperture to extend into the portion of the aperture 60 which is slightly below the surface of the inclined ramp 36. When the tube 70 is fully inserted into the aperture 60, the end of the tube 70 engages the projection 59 to rotate it upwardly, as shown in FIG. 5; so that the end 58 on the lever arm 54 is moved clear of the surface of the inclined ramp 36 and clear of the upper surface of any integrated circuit devices 17 on the ramp 36.

Figure 2:
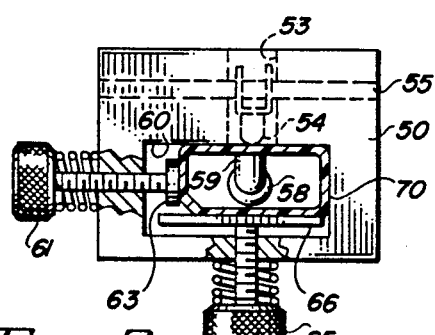
FIG. 2 is a cross-sectional view taken along the line 2—2 of FIG. 1.

FIG. 2 shows the cross section of a tube 70 as it is initially inserted into the aperture 60 prior to engagement of the end of the tube 70 with the projection 59. In this view, it can be seen that the end 58 of the lever arm 54 extends into the path of any integrated circuit devices 17 which are to be loaded into the tube 70.

As also illustrated in FIG. 2, bottom and side clamping plates 63 and 66 are shown. These clamping members comprise plates 63 and 66 for the side and bottom of the tube 70, respectively. Once the tube 70 is fully inserted into the aperture 60, as shown in FIG. 5, thumbscrews 61 and 65 are rotated to tighten the plates 63 and 66, respectively, against the tube 70 to hold it in place in the position shown in FIGS. 2 and 3. It should be noted that the aperture 60 is larger in both the horizontal and vertical dimensions than the tube 70, which is inserted into it. For larger integrated circuit devices, larger tubes 70 may be used; and the position of the clamping plates 63 and 66 are adjusted accordingly.

Figure 3:
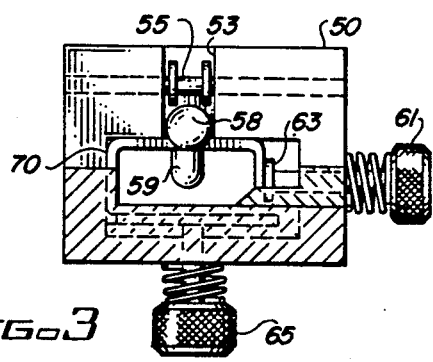
FIG. 3 is a cross-sectional view taken along the line 3—3 of FIG. 1.

FIG. 3 is a view from the opposite end of the aperture 60, namely the end into which the integrated circuit devices 17 are fed. In FIG. 3, the tube 70 is shown inserted to a point where it has engaged the projection 59 and is commencing to lift the projection 59 and the end 58 of the lever arm 54 up out of the path of integrated circuit devices on the ramp 36. This is a partially inserted position. FIG. 5 shows the fully inserted position, as described previously.

Figures 6, 7:
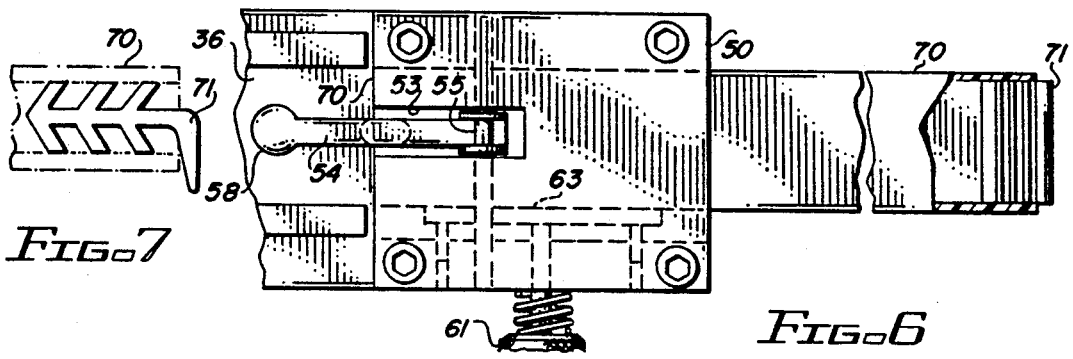
FIG. 6 is a top view of a portion of the embodiment shown in FIG. 1.
FIG. 7 is a detail of the portion circled as "7" in FIG. 1.

FIG. 6 is a top view of the apparatus, again, showing the relative positions of the different parts which are illustrated in detail in FIGS. 2 through 5.

The storage and transport tube 70 is closed at its lower end with a plug 71 of standard configuration. Once the tube has been fully loaded, a similar plug or other type of closure may be used on the end into which the integrated circuit devices originally are inserted. When a tube 70 is filled, the thumbscrews 61 and 65 are loosened and the tube 70 is withdrawn. This causes the lever arm 54 to rotate counterclockwise (as viewed in FIGS. 4 and 5) to the position shown in FIG. 4, and to engage the top of an integrated circuit device 17 or to engage the surface of the ramp 36, as illustrated in FIG. 1.

When the next tube 70 is inserted into the position shown in FIG. 5, the blocking member 58 on the lever arm 54 is moved to the position shown in FIG. 5, and loading of the next tube is effected. It is apparent from the foregoing description that a continuous supply of integrated circuit devices 17 may be present on the ramp 36 without feeding of any such devices through the aperture 60 unless a tube 70 is in place, and unless that tube is not filled. Consequently, the apparatus eliminates the necessity for physically handling any of the integrated circuit devices 17 to load them or reload them into the storage and transport tubes 70. Tubes 70 may be removed from and inserted into the tube holding block 50 at any time.

The foregoing description of the preferred embodiment of the invention should be considered as illustrative and not as limiting. For example, the blocking member which has been described is in the form of a gravity-operated pivotal lever 54. The blocking member could also be in some other form, which is electrically or pneumatically operated in response to the position of a tube 70 in the block 50. Other configurations of the block 50 may be employed for holding a tube 70 in place during the loading operation. Spring loaded holding plates or pneumatically or electrically operated holding plates may be used instead of the thumbscrew movable holding plates shown in the preferred embodiment. Such modifications and changes, along with others, will occur to those skilled in the art without departing from the true scope of the invention as defined in the appended claims.

I claim:

1. A tube loader for facilitating the loading of integrated circuit devices into a storage and transport tube including in combination:

an inclined ramp with an upper end and a lower end and having a guideway for gravity feeding integrated circuit devices from the upper end of said ramp to the lower end thereof;

a tube holder member attached to the lower end of said inclined ramp and having a tube-receiving aperture therein in alignment with the guideway on said ramp;

blocking means on said tube holder member for preventing integrated circuit devices from moving into the tube-receiving aperture of said tube holder member when no storage and transport tube is located therein; and means responsive to the presence of a storage and transport tube in the tube receiving aperture of said tube holder member for releasing said blocking means to permit integrated circuit devices to move from said ramp into a storage and transport tube located in the tube-receiving aperture of said tube holder member.

2. The combination according to claim 1 wherein said blocking means is a mechanical blocking means.

3. The combination according to claim 2 wherein said blocking means automatically operates upon the removal of a storage and transport tube from the aperture in said tube holder member.

4. The combination according to claim 3 wherein said blocking means comprises a lever arm for frictionally engaging an integrated circuit device located on said inclined ramp outside the aperture in said tube holder member.

5. The combination according to claim 3 wherein said blocking means comprises a pivoted lever arm coupled with said tube holder member and extending into the guideway on said inclined ramp when no storage and transport tube is present in the aperture of said tube holder member.

6. The combination according to claim 5 further including means for releasably holding a storage and transport tube in the aperture of said tube holder member.

7. The combination according to claim 6 wherein said holding means comprises manually operated clamping means.

8. The combination according to claim 7 wherein said manually operated clamping means comprises at least one movable plate member located within the aperture in said tube holder member for frictional engagement with a storage and transport tube inserted into such aperture of said tube holder member.

9. The combination according to claim 8 wherein said plate member is moved into engagement with a storage and transport tube located in the tube-receiving aperture of said tube holder member by means of a manually operated thumbscrew.

10. The combination according to claim 1 wherein said blocking means comprises a lever arm pivoted at one end on said tube holder member, with the free end thereof extending into the guideway of said inclined ramp with no storage and transport tube located in the aperture of said tube holder member, said lever arm further including an extension thereon for engagement by the end of a storage and transport tube to pivot the free end of said lever arm out of the guideway on said ramp when a storage and transport tube is inserted into the tube-receiving aperture of said tube holder member.

11. The combination according to claim 10 further including means for releasably holding a storage and transport tube in the aperture of said tube holder member.

12. The combination according to claim 11 wherein said holding means comprises manually operated clamping means.

13. The combination according to claim 1 wherein said blocking means automatically operates upon the removal of a storage and transport tube from the aperture in said tube holder member.

14. The combination according to claim 13 wherein said blocking means comprises a lever arm for frictionally engaging an integrated circuit device located on said inclined ramp outside the aperture in said tube holder member.

15. The combination according to claim 1 wherein said blocking means comprises a pivoted lever arm coupled with said tube holder member and extending into the guideway on said inclined ramp when no storage and transport tube is present in the aperture of said tube holder member.

16. The combination according to claim 1 further including means for releasably holding a storage and transport tube in the aperture of said tube holder member.

17. The combination according to claim 16 wherein said holding means comprises manually operated clamping means.

18. The combination according to claim 17 wherein said manually operated clamping means comprises at least one movable plate member located within the aperture in said tube holder member for frictional engagement with a storage and transport tube inserted into such aperture of said tube holder member.

19. The combination according to claim 18 wherein said plate member is moved into engagement with a storage and transport tube located in the tube-receiving aperture of said tube holder member by means of a manually operated thumbscrew.

* * * * *